US006606587B1

(12) United States Patent
Nassif et al.

(10) Patent No.: US 6,606,587 B1
(45) Date of Patent: Aug. 12, 2003

(54) METHOD AND APPARATUS FOR ESTIMATING ELMORE DELAYS WITHIN CIRCUIT DESIGNS

(75) Inventors: Nevine Nassif, Arlington, MA (US); Madhav Desai, Powai (IN); Dale Hayward Hall, Northborough, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/291,721

(22) Filed: Apr. 14, 1999

(51) Int. Cl.[7] .............................. G06F 17/50; G06F 9/45
(52) U.S. Cl. ................................. 703/14; 716/2; 716/5; 716/6; 716/8
(58) Field of Search ............................... 703/14; 716/2, 716/6, 8, 5; 702/108

(56) References Cited

U.S. PATENT DOCUMENTS

| | | | | |
|---|---|---|---|---|
| 4,907,180 A | * | 3/1990 | Smith | 703/14 |
| 5,305,229 A | * | 4/1994 | Dhar | 703/14 |
| 5,313,398 A | * | 5/1994 | Rohrer et al. | 703/14 |
| 5,359,535 A | * | 10/1994 | Djaja et al. | 716/6 |
| 5,519,350 A | * | 5/1996 | Diodato et al. | 327/295 |
| 5,703,798 A | * | 12/1997 | Dhar | 703/4 |
| 5,838,580 A | * | 11/1998 | Srivatsa | 716/8 |
| 5,841,333 A | * | 11/1998 | Fishburn et al. | 333/238 |
| 5,845,233 A | * | 12/1998 | Fishburn | 702/108 |
| 5,875,114 A | * | 2/1999 | Kagatani et al. | 716/6 |
| 5,880,967 A | * | 3/1999 | Jyu et al. | 716/6 |
| 6,005,265 A | * | 12/1999 | Kuroda | 257/208 |
| 6,009,248 A | * | 12/1999 | Sato et al. | 716/2 |
| 6,014,510 A | * | 1/2000 | Burks et al. | 703/19 |
| 6,088,523 A | * | 7/2000 | Nabors et al. | 702/108 |
| 6,182,269 B1 | * | 1/2001 | Laubhan | 716/5 |

OTHER PUBLICATIONS

Mu et al.; "Linearized sub-optimum method of long wire interconnects with uniform wire driver"; ISCAS '98; pp. 252-255; May 1998.*
Nagaraj et al.; "Approximate computation of signal characteristics of on-chip RC interconnect trees"; ISCAS '94; pp. 109-112; May, 1994.*
McCormick et al.; "Waveform moment methods for improved interconnection analysis"; Design Automation Conf.; pp. 406-412; Jun. 1990.*
Koide et al.; "A new performance driven placement with the Elmore delay model for row based VLSIs"; 1995 Design Automation Conf.; pp. 405-412; Aug. 1995.*
Zhu et al.; "Optimal sizing of high-speed clock networks based on distributed RC and lossy transmission line models"; ICCAD-93; pp. 628-633; Nov. 1993.*
Culetu et al.; "A practical repeater insertion method in high speed VLSI circuits"; Design Automation Conf.; pp. 392-395; Jun. 1998.*
Cong et al.; "Simultaneous driver and wire sizing for performance and power optimization"; IEEE Trans. VLSI Sys.; pp. 408-425; Dec. 1994.*
van Genderen et al.; "Reduced RC models for IC interconnections with coupling capacitances"; 1992 Proc. Design Automation; pp. 132-136; Mar. 1992.*

(List continued on next page.)

Primary Examiner—Hugh Jones

(57) ABSTRACT

A system for rapidly accurate Elmore delays is disclosed which uses circuit simulations with different circuit configurations to generate Elmore delay models. From data generated by the simulations, Elmore delays are represented as functions of a capacitance charge and device width for a variety of device configurations. Similarly, accurate capacitance models are determined for each device. To determine an Elmore delay for a discharge path, the appropriate models are applied to each device and summed together. Within a timing verifier, the present invention can rapidly determine critical paths which require additional consideration.

16 Claims, 7 Drawing Sheets

OTHER PUBLICATIONS van Genderen et al.; "Extracting simple but accurate RC models for VLSI interconnect"; Ckts & Syst.; pp. 2351–2354; Jun 1998.*

Siomacco et al.; "parametric modeling of integrated circuit interconnections"; IEEE Trans. Ckts & Syst. II: Analog & Digital; pp. 277–382; Jun. 1992.*

Boese et al.; "Fidelity and near–optimality of Elmore–based routing constructions"; 1993 IEEE ICCD; pp. 81–84; Oct. 1993.*

Un et al.; "Calculation of delay and rise times for uniformly distributed RLC line"; 9th Mediterranean Electrotechnical Conf.; pp. 604–607; May 1998.*

Hodes et al.; "Dynamically–wiresized Elmore–based routing constructions"; ISCAS '94; pp. 463–466; May 1994.*

Kahng et al.; "An analytical delay model for RLC interconnects"; IEEE Trans. CAD of ICs; pp. 1507–1514; Dec. 1997.*

Vlach et al.; "Group delay as an estimate of delay in logic"; IEEE Trans. CAD of ICs; pp. 949–953; Jul. 1991.*

Nevine Nassif et al., "Robust Elmore Delay Models Suitable For Full Chip Timing Verification of a 600MHz CMOS Microprocessor," ACM 35th Design Automation Conference, Jun. 1998.

H. Fair et al., Clocking Design and Analysis for a 600MHz Alpha Microprocessor, 1998 IEEE International Solid–State Circuits Conference, pp. 324–325, 398–399 and 467.

William J. Grundmann, et al. "Designing High Performance CMOS Microprocessors Using Full Custom Techniques," ACM Design Automation Conference, 1997.

John K. Ousterhout, "A Switch–Level Timing Verifier For Digital MOS VLSI," Copyright 1985, IEEE Transactions on Computer–Aided Design, vol. CAD–4, No. 3.

Jorge Rubinstein, et al. "Signal Delay in RC Tree Networks," Copyright 1983 IEEE, pp. 202–211.

W.C. Elmore, "The Transient Response of Damped Linear Networks With Particular Regard to Wideband Amplifiers", *Journal of Applied Physics* vol. 19 pp. 55–63 Jan. 1948.

C.–J. Shi, "Analysis, Sensitivity and Macromodelling of the Elmore Delay in Linear Networks for Performance–Driven VLSI Design," *Int. J. Electronics*, vol. 75, No. 3, pp 462–484 (1993).

Madhav P. Desai et al., "A Systematic Technique for Verifying Critical Path Delays in a 300 MHz Alpha CPU Design Using Circuit Simulation," ACM Design Automation Conference '96 pp. 125–130.

Tzu–Mu Lin et al., "Signal Delay in General RC Networks," IEEE Transactions on Computer–Aided Design, vol. CAD–3, No. 4, Oct. 1984, pp. 331–349.

Denis Martin et al., "Delay Prediction From Resistance–Capacitance Models of General MOS Circuits," IEEE Transactions on Computer–Aided Design of Integrated Circuits and Systems, vol. 12, No. 7, Jul. 1993, pp. 997–1003.

* cited by examiner

US 6,606,587 B1

METHOD AND APPARATUS FOR ESTIMATING ELMORE DELAYS WITHIN CIRCUIT DESIGNS

BACKGROUND OF THE INVENTION

1. Field of the Invention

The present invention relates to the estimation of Elmore delays within circuit designs. More particularly, it relates determination of Elmore delays and a 50% point delay in a timing verifier using information relating to charges of MOS devices.

2. Discussion of the Related Art

The Elmore delay, first presented in W. C. Elmore, "The Transient Response of Damped Linear Networks with Particular Regard to Wide Band Amplifier", Journal of Applied Physics, Volume 19, 55–63 (January 1948), has been used extensively as a measure of delay for RC interconnect and for MOS circuits. Given an RC tree, the Elmore delay is computed using an equation based upon the resistance and capacitance of different paths to a defined output.

Elmore delay calculations are used in timing verification of circuits. In designing circuits, it is important to rapidly identify circuit paths of concern. One method for identifying potential problems with a circuit design is by reviewing the timing of Elmore delays within the circuit. If certain circuit paths appear to have difficulties, then a circuit simulator can be used to check these paths for potentially necessary modifications. For effective verification, a timing verifier needs to identify critical circuit paths quickly. In order to do this, various models for determining Elmore delays have been created. In particular, a resistance and capacitance are used to approximate each MOS device within the circuit by a corresponding RC structure for the calculation of the Elmore delay. Algorithms have also been developed to compute an Elmore delay for a MOS circuit. T. M. Lynn and C. A. Mead, "Signal Delay and General RC Networks", IEEE Transaction on Computer Aided Design, Vol. CAD-3,4, 331–349 (October 1984), and D. Martin and R. C. Rumin, "Delay Prediction from Resistance-Capacitance Model of General MOS Circuits", IEEE Transactions on Computer Aided Design and Integrated Circuits and Systems, Vol. No. 12, 7, 997–1003 (July 1993), disclose various procedures for estimating Elmore delays for MOS devices within a circuit. In such algorithms, the resistance and capacitance models used to approximate the MOS circuit are a great source of error in computing the Elmore delay. Part of the difficulty in determining such values is that the resistance and capacitance depends upon the structure of the circuit, not solely each device itself.

In determining Elmore delays for timing verification, it is important not to miss any critical paths. Therefore, timing verifiers typically have ignored the effect of the circuit itself on the determination of the resistance and capacitance used to represent each device. Rather, timing verifiers have relied upon determinations of maximum and minimum capacitance and resistance models so that no critical paths are missed. This, however, results in highly inaccurate models and the identification of many false positives for critical paths. Each critical path identified must be further analyzed and verified using more accurate methods of circuit simulation. Therefore, the identification of many false positives results in significant time delays and additional work. Therefore, a need exists for more accurate determinations of Elmore delays within timing verifiers.

SUMMARY OF THE INVENTION

The present invention overcomes many of the deficiencies of the prior art by providing a method and apparatus for generating accurate models for Elmore delays from accurate estimates of charges. According to one aspect of the invention, performance of different circuit structures is simulated based upon characteristics of the circuit being designed to generate models for Elmore delays with different basic circuit structures. According to another aspect of the invention, models for determining Elmore delays are generated as functions of specific circuit configurations, device widths, and charges.

According to another aspect of the invention, the models for the Elmore delays are used in a timing verifier to determine critical paths within a circuit design. Specifically, the system analyzes the design of the circuit to determine a path. It then uses the appropriate model for each device to determine individual Elmore delays. Finally, the Elmore delay for each of the devices is combined to generate the Elmore delay for each path.

According to another aspect of the invention, a simulation procedure is also used for determining charges for each of the MOS devices in the circuit. As in generating Elmore delay models, simulations are run on various circuit configurations to determine charges for basic circuit structures. When the charge of the device needs to be used within the timing verifier, the appropriate model is selected.

DETAILED DESCRIPTION

Figure 1:
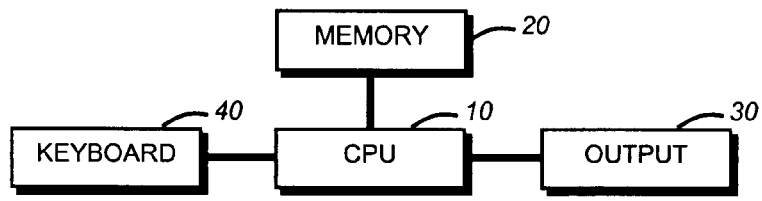
FIG. 1 illustrates computer hardware which can be used to implement the present invention.

FIG. 1 represents hardware which can be used to implement the present invention. The hardware corresponds to the elements of a general purpose computer. Of course, these elements could be replaced with a special purpose computer or equivalent hardware and software elements for carrying out the processes of the present invention as discussed below. As illustrated in FIG. 1, hardware can include a central processing unit (CPU) 10 which executes digital instructions. Instructions are stored and retrieved from a memory 20 connected to the CPU 10. In addition to instructions, the memory 20 stores data used and processed by the CPU 10 in executing the instructions. A keyboard 40 is connected to the CPU 10 in order to input data or other information which can be stored in the memory 20 or used by the CPU 10. This system includes an output 30 also connected to the CPU 10. The output 30 can be of a variety of types depending upon the subsequent processing necessary for the output. For example, the output can include a display, a printer, a disk drive, or other elements for outputting magnetic or electronic information.

Figure 2:
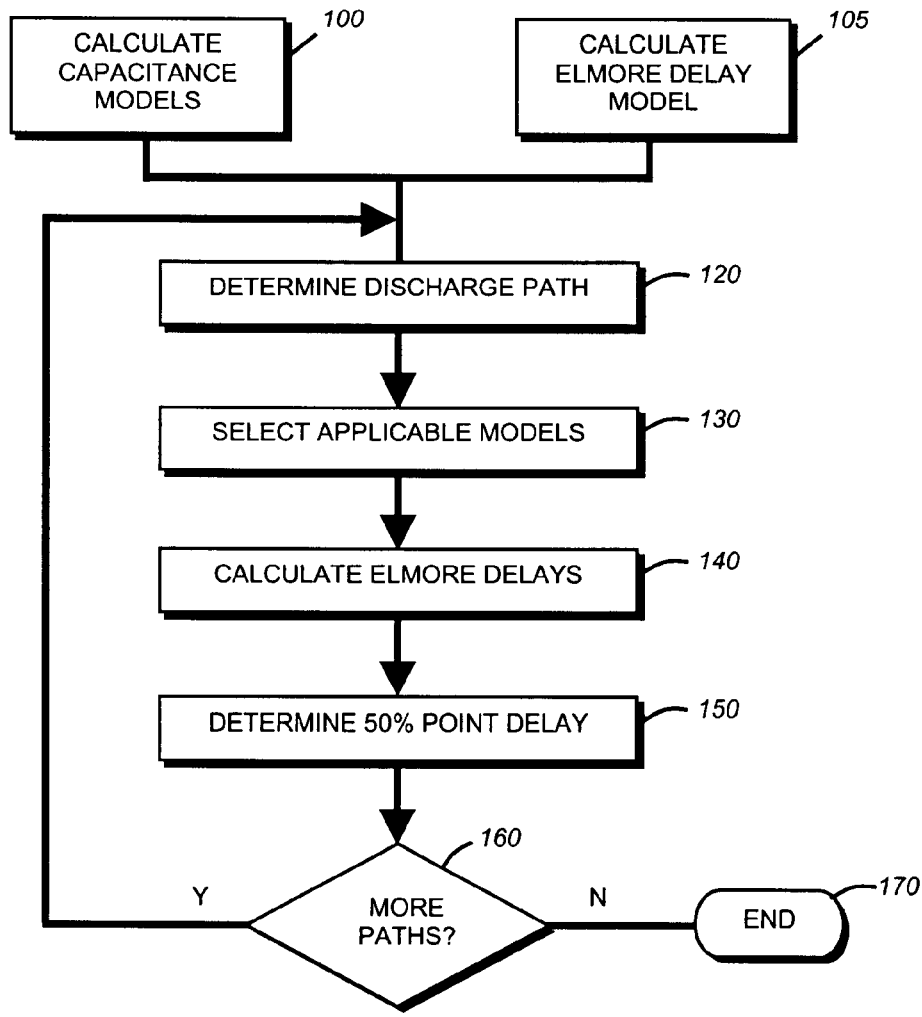
FIG. 2 is a flow diagram illustrating operations of the present invention.

FIG. 2 illustrates a flow chart for operation of the system according to an embodiment of the present invention. FIG.

2 illustrates the steps that can be carried out in the computer hardware as illustrated in FIG. 1 in order to perform the functions of the present invention. Such steps may be appropriately programmed instructions stored in the memory 20 and executed on the CPU 10. Alternatively, other hardware and software structures and steps can be used to implement the functions of the present invention. The system need only be able to represent and analyze circuit structures and performance in the manner described below.

Figure 3:
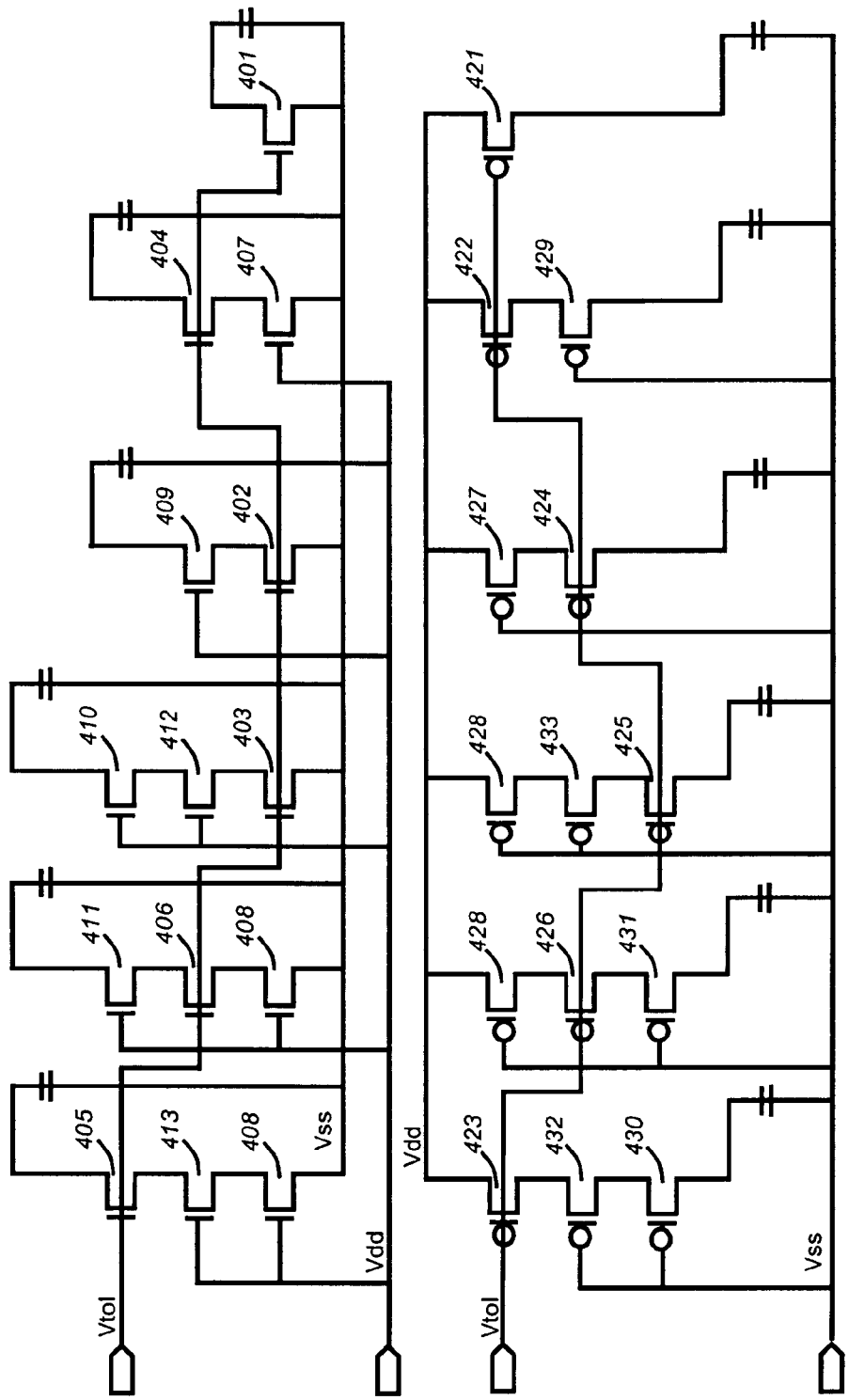
FIG. 3 illustrates circuit structures for generating Elmore delay models.

At step 110, models for Elmore delays within individual MOS devices are generated. The Elmore delay for a discharge path is equal to the sum of the Elmore delays of each of the devices in the path. However, the Elmore delay for a single device depends upon physical characteristics of the device (width, length, doping), the various inputs to each of its terminals (source, drain, gate, substrate), the type of device (NMOS, PMOS), the various types of devices connected to it, and the charge discharged through the device. Therefore, in order to generate Elmore delay models for individual devices, simulations of device performance are run for a variety of possible circuit configurations. FIG. 3 illustrates configurations for NMOS and PMOS devices which can be used in determining Elmore delays. The specific configurations which need to be modeled depend upon the structures of the circuit being designed. With the configurations illustrated in FIG. 3, a sufficient set of models for devices is generated in order to determine all Elmore delays for any circuit.

Using a circuit simulator, such as SPICE, the circuit configurations illustrated in FIG. 3 can be processed to determine specific Elmore delays for each of the devices in the configurations under various conditions. Generally, the conditions used in the simulation will correspond to conditions under which the circuit being designed would operate, such as expected temperatures and specific waveforms. Using different simulations with various conditions, a variety of data points are determined for Elmore delays corresponding to the specified conditions. The data points for each configuration can then be analyzed using curve fitting techniques to generate a model for the Elmore delay as a function of characteristics for each device Table 1 illustrates models generated for the configurations in FIG. 3. Simulations performed according to the system of the present invention indicate the Elmore delay models within each configuration depend upon the charge (Q), width (W) of the MOS device, and the high voltage value for the circuit (VDD).

TABLE 1

ELMORE DELAY MODELS

| Device Number | Source | Drain | Stack | Gate | Model | Max Error |
|---|---|---|---|---|---|---|
| NMOS: | | | | | | |
| 401 | vss | at least one PMOS | 1 | rising | 21408.27*q/w + 18.73/w + 115.30 | 4.27% |
| 402 | vss | only NMOS | 2 | rising | 12735.09*q/w + 5.57/w + 96.02 | 1.11% |
| 403 | vss | only NMOS | >2 | rising | 11910.55*q/w + 4.31/w + 93.86 | 0.54% |
| 404 | not vss | at least one PMOS | 2 | rising | 24802.26*q/w + 15.89/w + 112.39 | 5.00% |
| 405 | not vss | at least one PMOS | >2 | rising | 27613.26*q/w + 6.35/w + 111.55 | 5.32% |
| 406 | not vss | only NMOS | >2 | rising | 14049.49*q/w + 3.00/w + 99.30 | 0.70% |
| 407 | vss | only NMOS | 2 | high | 12572.72*q/w + 1.04/w | 7.69% |
| 408 | vss | only NMOS | >2 | high | 11942.96*q/w + 0.72/w | 4.69% |
| 409 | not vss | at least one PMOS | 2 | high | 24022.64*q/w + 7.89/w + 22.75 | 4.47% |
| 410[1] | not vss | at least one PMOS | >2 | high | 25832.73*q/w + 9.24/w + 25.67 | 3.09% |
| 411[2] | not vss | at least one PMOS | >2 | high | 26569.19*q/w + 7.86/w + 22.08 | 4.66% |
| 412[3] | not vss | only NMOS | >2 | high | 14044.53*q/w + 1.88/w + 12.65 | 1.30% |
| 413[4] | not vss | only NMOS | >2 | high | 13752.80*q/w + 1.06/w | 12.77% |
| PMOS: | | | | | | |
| 421 | vdd | at least one NMOS | 1 | falling | 53619.12*q/w + 138.05 | 1.93% |
| 422 | vdd | only PMOS | 2 | falling | 38655.48*q/w + 124.22 | 0.81% |
| 423 | vdd | only PMOS | >2 | falling | 36761.50*q/w + 123.55 | 0.79% |
| 424 | not vdd | at least one NMOS | 2 | falling | 63930.55*q/w + 145.24 | 1.64% |
| 425 | not vdd | at least one NMOS | >2 | falling | 71151.18*q/w + 151.12 | 2.65% |
| 426 | not vdd | only PMOS | >2 | falling | 43438.12*q/w + 136.20 | 1.09% |

TABLE 1-continued

ELMORE DELAY MODELS

| Device Number | Source | Drain | Stack | Gate | Model | Max Error |
|---|---|---|---|---|---|---|
| 427 | vdd | only PMOS | 2 | low | 38526.54*q/w | 3.01% |
| 428 | vdd | only PMOS | >2 | low | 37432.88*q/w | 4.15% |
| 429 | not vdd | at least one NMOS | 2 | low | 65357.45*q/w + 39.09 | 3.40% |
| 430[5] | not vdd | at least one NMOS | >2 | low | 74157.39*q/w + 52.41 | 3.93% |
| 431[6] | not vdd | at least one NMOS | >2 | low | 74603.27*q/w + 41.64 | 4.4% |
| 432[7] | not vdd | only PMOS | >2 | low | 43481.65*q/w + 24.88 | 1.25% |
| 433[8] | not vdd | only PMOS | >2 | low | 42935.38*q/w | 5.89% |

Figure 4:
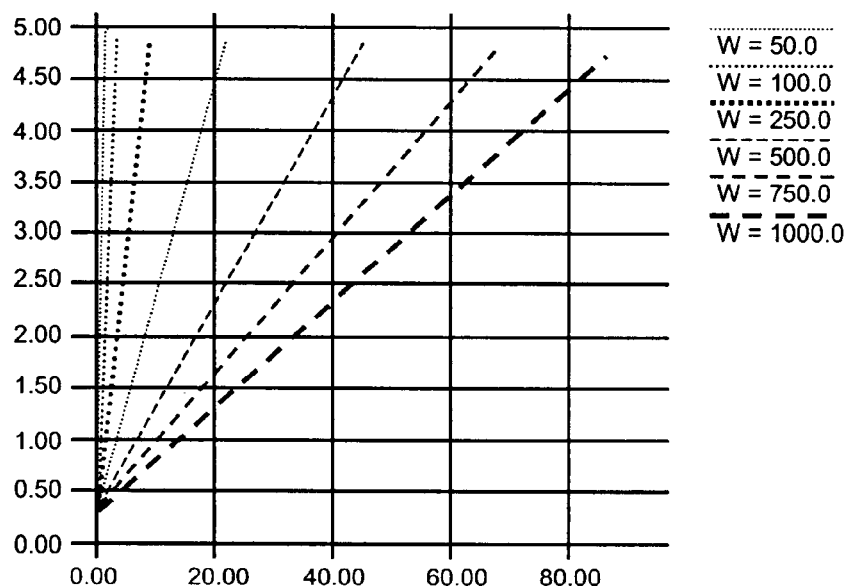
FIG. 4 is a graph of delay simulation data.

[1] Transitioning device in the stack has its source at VSS
[2] Transitioning device in the stack does not have source at VSS
[3] Transitioning device in the stack is between device 412 and VSS
[4] Transitioning device in the stack is between device 413 and a any PMOS structure
[5] Transitioning device in the stack has its source at VDD
[6] Transitioning device in the stack does not have source at VDD
[7] Transitioning device in the stack is between device 432 and VDD
[8] Transitioning device in the stack is between device 433 and a any NMOS structure FIG. 4 illustrates a plot of the Elmore delays ($\tau_m$) from simulation as a function of Q for various device widths. The plot shows a near linear relationship between Q and the Elmore delay. Based upon the simulation data, a linear equation can be derived of the form:

$$\tau_m VDD = k_2 Q/W + k_1 1/W + k_0 \quad (1)$$

The coefficients ($k_2$, $k_1$, $k_0$) for equation (1) vary based upon the conditions of the circuit and the configuration around the MOS device, as noted in Table 1. Thus, the simulation data is used to determine the coefficient values which represent models for the Elmore delay values. In order to insure that no critical paths are missed, the coefficients can be selected using curve fitting techniques so that the equation value exceeds all of the corresponding points in the simulation data. As noted in Table 1, the maximum error between the models based upon equation (1) and data determined in simulations with SPICE is less than 5% for more than two thirds in the configurations of FIG. 3. The maximum error for remaining configurations is less then 10%. Since the data determined using a circuit simulator such as SPICE is anticipated to be highly accurate of the actual circuit operation, the Elmore delay models generated according to the present invention are also highly accurate. As can be seen, the Elmore delay models generated according to the present invention are modeled to be dependent upon solely the charge Q discharged through each device and the width W of the device. The models do not include the resistances of the devices as explicit parameters, in contrast to the use of resistances in other systems for determining Elmore delays. Of course, the Elmore delays are also dependent upon the length of the devices. A separate set of models of the type of Equation 1 are generated for various values of the length L.

In order to utilize the models generated at step 110 (FIG. 2), the charges need to be determined. Any procedure can be used for determining charges to be incorporated in the Elmore delay models of the present invention. In the flow chart of FIG. 2, step 100 represents determining the charges. Of course, the charges can be determined before or after the Elmore delay models are created.

Figure 5:
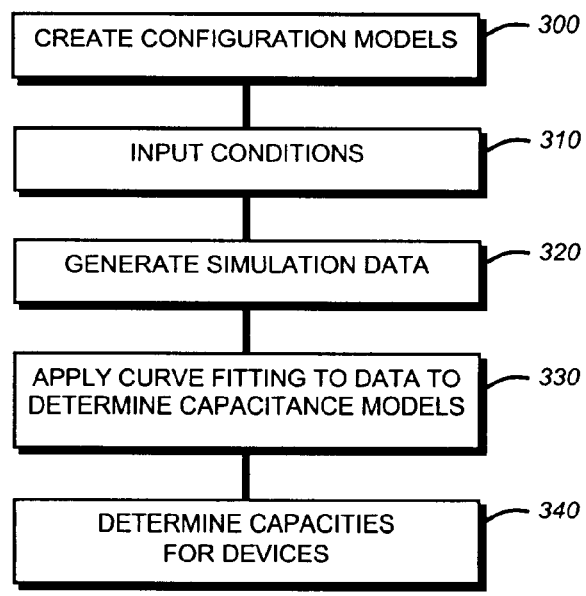
FIG. 5 is a flow chart illustrating determination of charge according to an embodiment of the present invention.
Figure 6A:
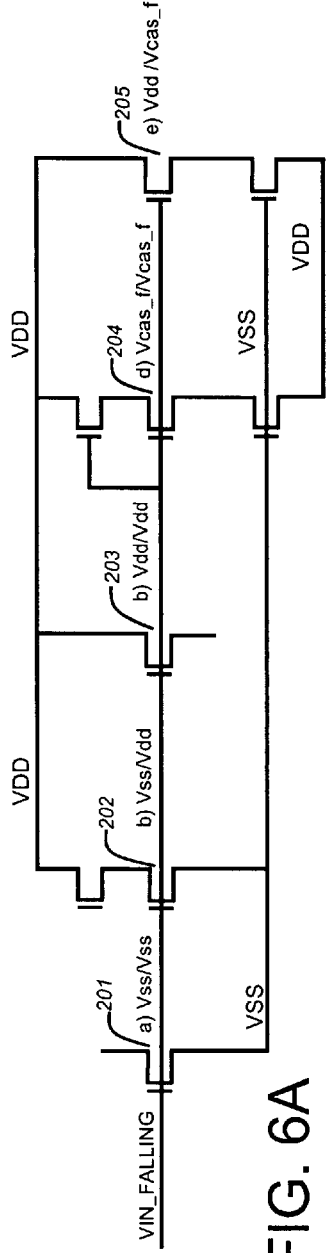
FIGS. 6A–6F illustrate circuit structures for determining models of charges according to the present invention.
Figure 6B:
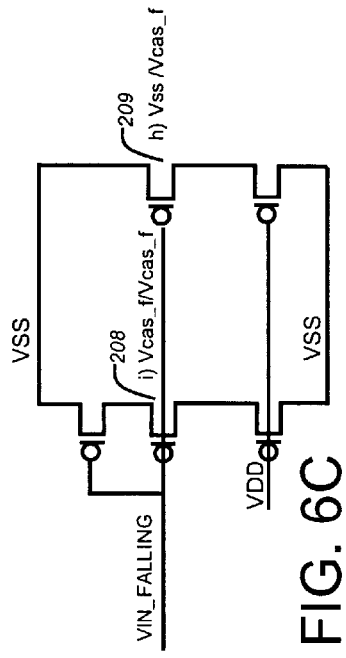
Figure 6C:
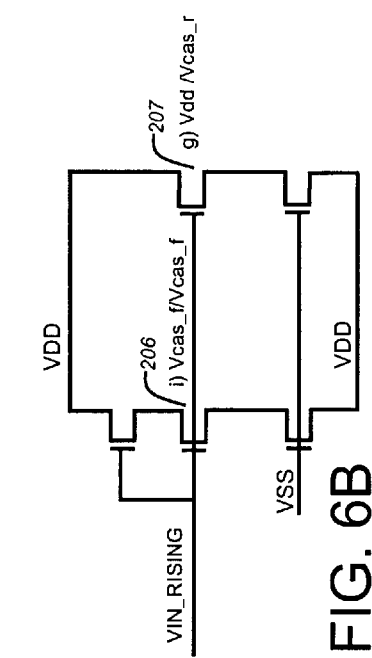
Figure 6D:
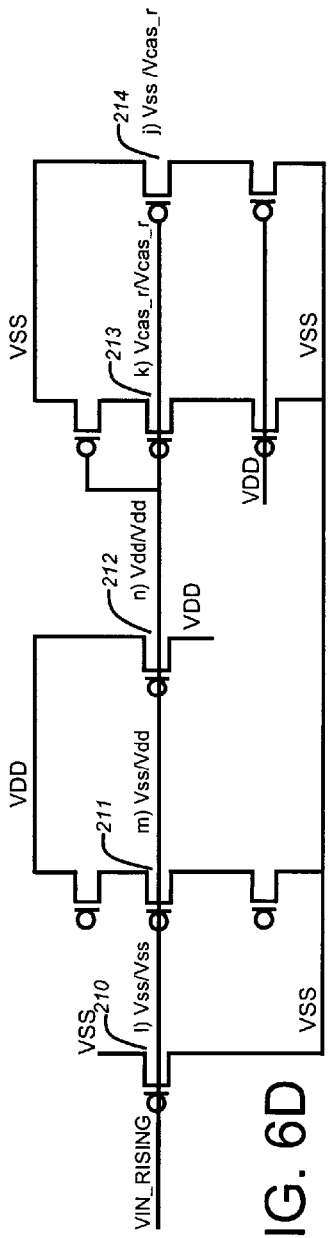
Figure 6E:
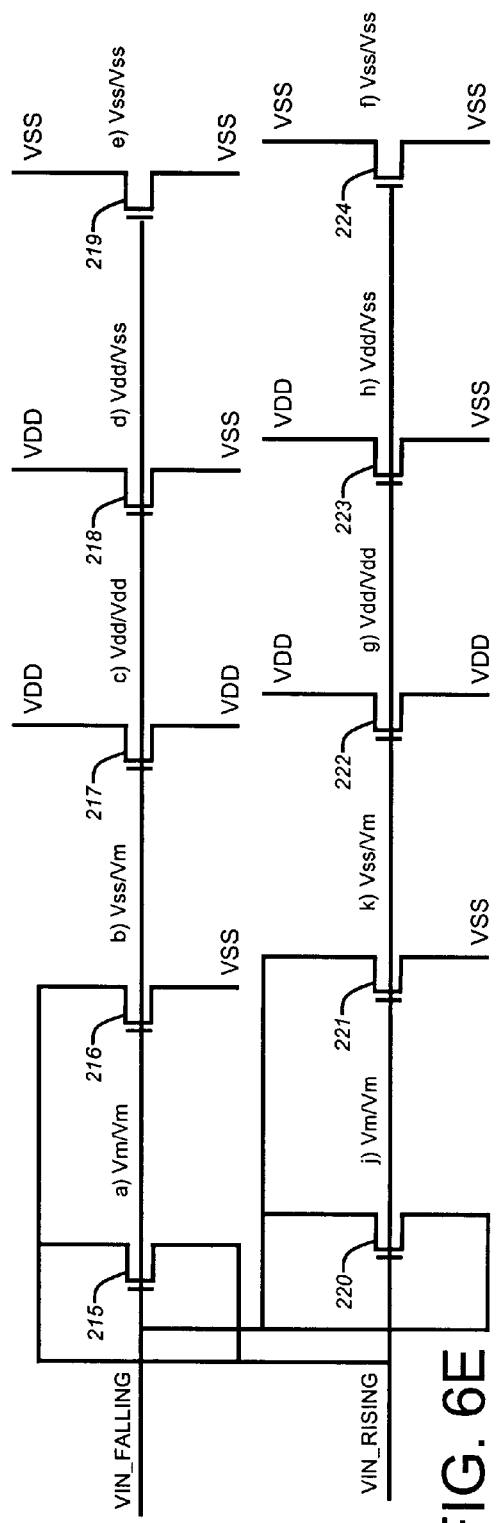
Figure 6F:
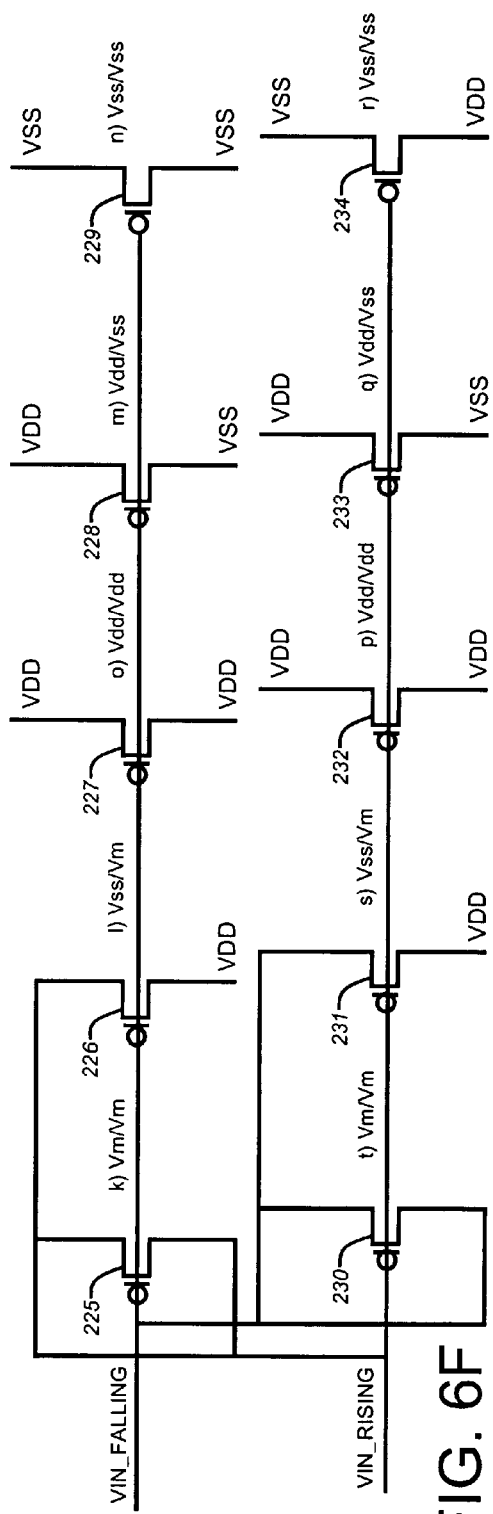

The accuracy of the Elmore delays calculated using the models generated in step 110 depends upon the accuracy of the charges determined in step 100. One possible method for determining the charges uses models generated in a manner similar to that used in determining the Elmore delay models. A set of simulations is performed on a variety of circuit configurations using a circuit simulator such as SPICE. The simulations are run on the various configurations to determine the capacitances and charges for each configuration using characteristics applicable to the circuit being designed. Curve fitting techniques are then used to determine models for charges as a finction of the width and length of the devices based upon the data. The charge models can then be used to determine charges for each device with the circuit being designed. These charges can then be used in conjunction with the Elmore delay models for determining Elmore delays. This process for generating charges is illustrated in the flow chart of FIG. 5. At step 300, models are created for configurations of devices. FIGS. 6A–6F illustrate schematics which can be used for different potential configurations. At step 310, initial conditions are input. As noted above, the conditions are based upon operating characteristics of the devices and circuit. Simulation data is then generated for a variety of widths and lengths of devices within each configuration at step 320. Curve fitting techniques are applied at step 330 to generate the charge model. The procedure for determining charge models and values is described more fully in the patent application Ser. No. 09/208,780, entitled "Method and Apparatus for Estimating Charges on MOS Devices," filed on Dec. 10, 1998, and incorporated herein by reference.

Figure 7:
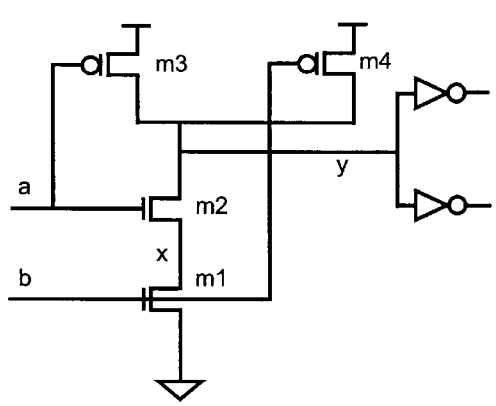
FIG. 7 illustrates a sample circuit structure analyzed in accordance with the present invention.
Figure 8A:
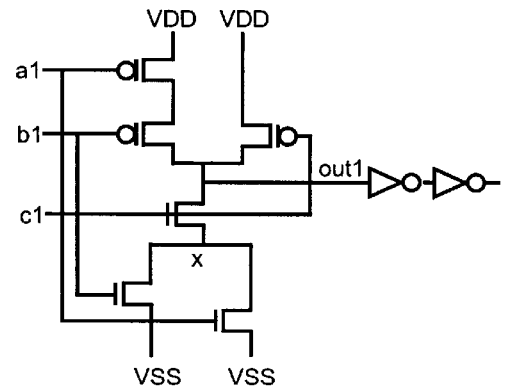
FIGS. 8A–8F illustrate different sample circuit structures analyzed in accordance with the present invention.
Figure 8B:
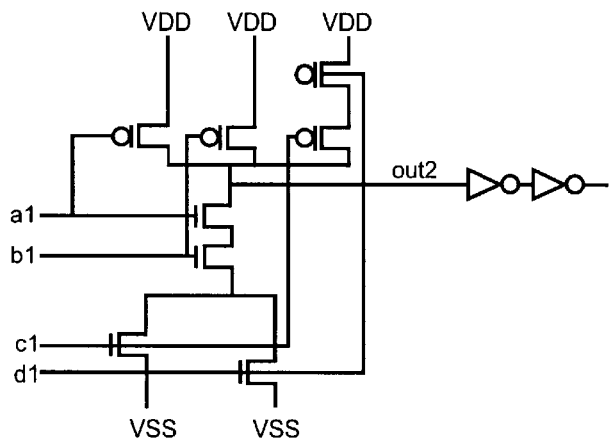
Figure 8C:
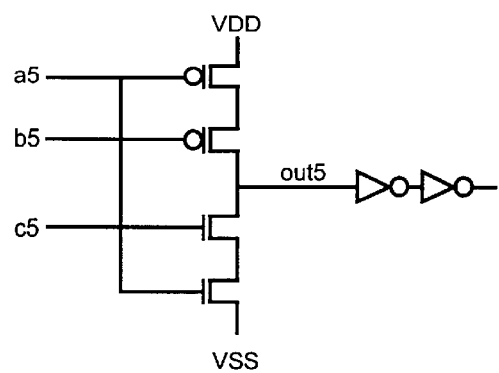
Figure 8D:
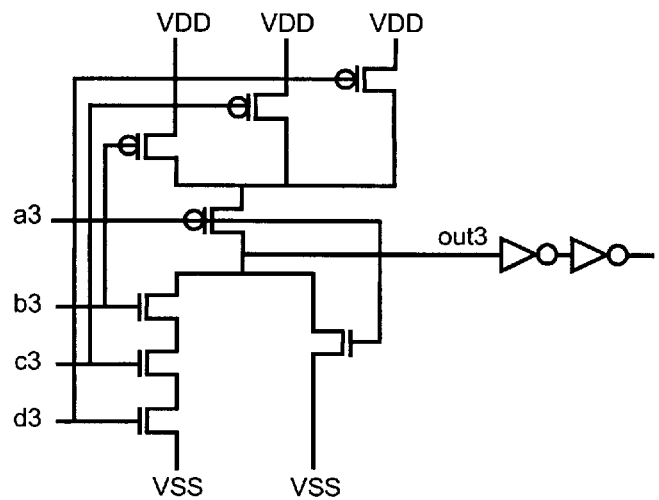
Figure 8E:
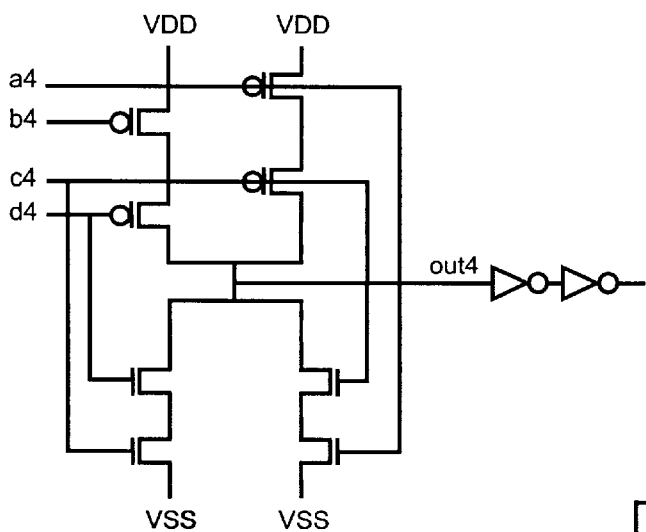
Figure 8F:
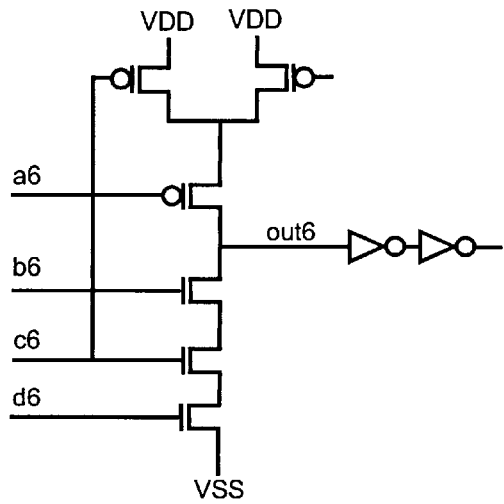

Once the Elmore delay models and the charge models have been determined in accordance with the procedures discussed above, the models can be used for determining Elmore delays within a circuit. Steps 120–160 illustrate the process for determining Elmore delays for discharge paths within the circuit. Based upon a representation of the circuit within the computer system memory 20, the system determines discharge paths in step 120. Various timing verifiers are able to determine discharge paths using representations of the circuit within computer memory. Any such method can be used in step 120 for determining the discharge paths. At step 130, the appropriate models for Elmore delays and for charges are selected corresponding to the discharge paths. For example, FIG. 7 illustrates a simple circuit structure. If input B is rising the discharge path will be from the output node Y through the node X to VSS. The Elmore delay at output node Y will be the sum of the Elmore delays through devices M1 and M2. M1 represents a device which is turning on. The device has a souce is connected to VSS and a drain connected to a source of an NMOS device. Device M2 is a device which is on with a source connected to an NMOS device and a drain connected to the drain of a PMOS device connected to VDD. Using the widths and lengths of the devices, the appropriate charges can be determined using the appropriate models generated in step 100. Once the charges have been computed, the Elmore delay model generated in step 110 for an NMOS device turning on with a source connected to VSS it is used to compute the Elmore delay of device M1. A model for an NMOS device which is on and whose drain is connected to the output node is used to compute the Elmore delay of device M2. The two delays are then added to determine the total Elmore delay for this discharge path. The determination of the separate Elmore delays and combining them is represented in step 140 of FIG. 2.

At step 150, the 50% point delay of the circuit structure is determined. For symmetric waveforms, the Elmore delay is a 50% point delay. However, with asymmetric waveforms a modification must be performed. A waveform model is used to map the Elmore delay to a 50% point delay. The equations for the waveform model are based upon a set of presimulated configurations and are a function of the Elmore delay and the slope of the input waveform. Various methods are known for modeling waveforms and determining 50% point delays. Any of these known methods can be used with the present invention.

Once the modeling of the charges and Elmore delays has been completed, the system can determine Elmore delays within a circuit relatively rapidly. FIGS. 8A–8F illustrates the complexity of circuits used to determine the speed and accuracy of the present invention. On an Office Server 8400 Model 5/300 (300 Megahertz CPU) from Digital Equipment Corporation, a system programmed to execute the steps of the present invention can determine more than 20,000 delays per second for circuits of the complexity shown in FIGS. 8A–8F. This rate includes identifying the discharge path, computing the charge at every node, computing the Elmore delay, and computing the 50% point delay. In comparison, only four delays per second can be computed with SPICE after the input stimulus has been manually set up. Thus, the system of the present invention is able to determine Elmore delays much more quickly than circuit simulation.

At step 160, the system determines whether other discharge paths should be considered. If so, it returns to step 120 to calculate additional paths. If no discharge paths remain, the systems ends operation at step 170.

This system is also very accurate in determining Elmore delays. Table 2 describes the difference in the Elmore delay calculations between the present invention and SPICE for the some of the inputs represented in FIGS. 8A–8F. In all cases, the Elmore delay was found to be less than 10% greater than the Elmore delay calculated using SPICE. However, use of waveform models to determine the 50% point delay show greater variation. Tables 3A, 3B, and 3C respectively represent the difference between the present invention and SPICE for determining

TABLE 2

| Input | Rising | Falling |
|---|---|---|
| a1 | 6.1% | 3.9% |
| b2 | 5.1% | 3.0% |
| d3 | 3.4% | 5.6% |
| c4 | 1.5% | 2.7% |
| a5 | 4.0% | 3.0% |
| d6 | 2.0% | 3% |

TABLE 3A

Typical Input Slope

| Input | Rising | Falling |
|---|---|---|
| a1 | 3.9% | 1.2% |
| b2 | 1.3% | 11.2% |
| d3 | 0.8% | 23.1% |
| c4 | 0.4% | 6.2% |
| a5 | 7.9% | 1.0% |
| d6 | 2.4% | 18.6% |

TABLE 3B

Fast Input Slope

| Input | Rising | Falling |
|---|---|---|
| a1 | 5.5% | 4.1% |
| b2 | 0.7% | 13.1% |
| d3 | 3.6% | 22.7% |
| c4 | 3.8% | 4.5% |
| a5 | 9.0% | 11.6% |
| d6 | 2.7% | 7.0% |

TABLE 3C

Slow Input Slope

| Input | Rising | Falling |
|---|---|---|
| a1 | 0.3% | 1.0% |
| b2 | 0.3% | 11.8% |
| d3 | 5.6% | 23.6% |
| c4 | 4.4% | 2.4% |
| a5 | 6.3% | 0.9% |
| d6 | 0.0% | 30.0% | the 50% point delay for a typical input slope, a fast input slope and a slow input slope, respectively. In many instances, the determination of the 50% point delays still remains under 10%. Nevertheless, the use of the present invention in a timing verifier allows the determination of a large number of Elmore delays for various discharge paths. It is close to actual simulation values while remaining greater than them. Thus, a timing verifier using the present invention is able to rapidly determine critical paths with great accuracy and generally avoid false negatives and false positives.

Having thus described at least one embodiment, alterations, modifications and changes to the invention will be readily apparent to those of skill in this industry. Such modifications and changes are intended to be within the scope of the invention which is only limited by the claims appended hereto.

What is claimed is:

1. A timing verification system including representation of a circuit comprising:

path means for determining a discharge path through the circuit, wherein the discharge path includes at least one device;

model selection means for selecting an Elmore delay model, from a plurality of Elmore delay models, for each of the at least one device;

delay determining means for determining a path Elmore delay based upon the Elmore delay models selected for the at least one device.

2. The timing verification system of claim 1, further including 50% delay means for determining a 50% point delay based upon the path Elmore delay.

3. The timing verification system of claim 2, wherein said 50% delay means determines the 50% point delay based upon at least one waveform.

4. The timing verification system of claim 1, wherein said path means determines a plurality of paths through the circuit, and wherein the model selection means and delay means operate separately on each of said plurality of paths.

5. The timing verification system of claim 1, further comprising model creation means for creating the plurality of Elmore model delays.

6. The timing verification system of claim 5, wherein said model creation means includes:

means for performing a plurality of simulations, each simulation corresponding to operation of a plurality of devices within a plurality of circuit configurations, and corresponding to one of a plurality of parameters for each the plurality of devices;

means for determining an Elmore delay for each of the plurality of devices for each simulation; and means for creating an Elmore delay model for each of the plurality of devices based upon the Elmore delays from the means for determining and the plurality of parameters.

7. The timing verification system of claim 6, wherein said means for creating includes means for applying curve fitting techniques to the Elmore delays from the means for determining.

8. The timing verification system of claim 1, wherein said model selection means further includes means for selecting a charge model from a plurality of charge models as part of the selection of an Elmore delay model.

9. The timing verification system of claim 8, further comprising means for simulating operation of a plurality of devices in a plurality of circuit configurations to create said plurality of charge models.

10. A method of timing verification comprising the steps of:

determining a discharge path through a circuit, wherein the discharge path includes at least one device;

selecting an Elmore-delay model from a plurality of Elmore delay models, for each device in a discharge path; and determining a path Elmore delay based upon the Elmore-delay models selected for each device;

wherein said Elmore-delay model is defined as $\tau_m \text{VDD} = k_2 Q/W + k_1 L/W + k_0$, $\tau_m$ is an Elmore delay, VDD is the circuit's high voltage value, Q is a charge across the device, W is the device's width, L is the device's length, and $k_0$, $k_1$, and $k_2$ are coefficents that vary with circuit conditions.

11. The timing verification method of claim 10, further comprising the step of determining a 50% point delay based upon the path Elmore delay.

12. The timing verification method of claim 10, further comprising before the selecting step, the step of determining a plurality of circuit paths within a circuit, and performing the selecting and delay determining steps for each of the plurality of circuit paths.

13. The timing verification method of claim 10, further comprising before the selection step, the step of creating a plurality of Elmore delay models.

14. The timing verification method of claim 13, wherein creating step includes the steps of:

performing a plurality of simulations, each simulation corresponding to operation of a plurality of devices within a plurality of circuit configurations, and corresponding to one of a plurality of parameters for each of the plurality of devices;

determining an Elmore delay for each of the plurality of devices for each simulation; and creating an Elmore delay model for each of the plurality of devices based upon the Elmore delays from the step of determining path Elmore delay models and the plurality of parameters.

15. The timing verification method of claim 10, wherein selection step includes the step of selecting a charge model from a plurality of charge models as part of the selection of an Elmore delay model.

16. A system for creating Elmore delay models for devices within a circuit design comprising:

means for representing a plurality of devices within a set of circuit structures;

means for simulating operation of the set of circuit structures and determining an Elmore delay value for each of the plurality of devices based upon a set of device parameters; and means for applying curve fitting to the Elmore delay values to create an Elmore delay model for each of the plurality of devices based upon the set of device parameters.

* * * * *